(12) United States Patent
Zhang et al.

(10) Patent No.: US 11,960,745 B2
(45) Date of Patent: Apr. 16, 2024

(54) EMPTY PAGE SCAN OPERATIONS ADJUSTMENT

(71) Applicant: Micron Technology, Inc., Boise, ID (US)

(72) Inventors: Peng Zhang, Los Altos, CA (US); Murong Lang, San Jose, CA (US); Christina Papagianni, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 17/889,757

(22) Filed: Aug. 17, 2022

(65) Prior Publication Data
US 2024/0061600 A1  Feb. 22, 2024

(51) Int. Cl.
*G06F 3/06* (2006.01)
(52) U.S. Cl.
CPC .......... *G06F 3/0644* (2013.01); *G06F 3/0604* (2013.01); *G06F 3/0655* (2013.01); *G06F 3/0679* (2013.01)

(58) Field of Classification Search
CPC .... G06F 3/0644; G06F 3/0604; G06F 3/0659; G06F 3/0679
See application file for complete search history.

(56) References Cited

U.S. PATENT DOCUMENTS

| 11,545,232 | B1 * | 1/2023 | Sharifi Tehrani | ........ G11C 7/20 |
| 2019/0018602 | A1 * | 1/2019 | Koo | ........... G06F 3/0679 |
| 2020/0075114 | A1 * | 3/2020 | Lin | ........... G06F 11/1048 |

* cited by examiner

*Primary Examiner* — Hiep T Nguyen
(74) *Attorney, Agent, or Firm* — Schwegman Lundberg & Woessner, P.A.

(57) ABSTRACT

Aspects of the present disclosure configure a system component, such as memory sub-system controller, to perform empty page scan operations. The controller selects a portion of the set of memory components that is empty and ready to be programmed. The controller reads one or more signals from the selected portion of the set of memory components. The controller generates an error count value representing whether the portion of the set of memory components is valid for programming based on a result of reading the one or more signals from the selected portion. The controller updates a scan frequency for performing the empty page scan operations for the portion of the set of memory components based on the error count value.

20 Claims, 6 Drawing Sheets

| Page EC | <5 | 5-10 | 11-20 | 21-50 | >51 |
|---|---|---|---|---|---|
| Scan Frequency | 24 hours | 18 hours | 6 hours | 4 hours | Fails |

*FIG. 3*

EMPTY PAGE SCAN OPERATIONS ADJUSTMENT

TECHNICAL FIELD

Embodiments of the disclosure relate generally to memory sub-systems and, more specifically, to performing empty page scanning operations in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3 is a block diagram of an example scan frequency table, in accordance with some implementations of the present disclosure.

DETAILED DESCRIPTION

Figure 1:
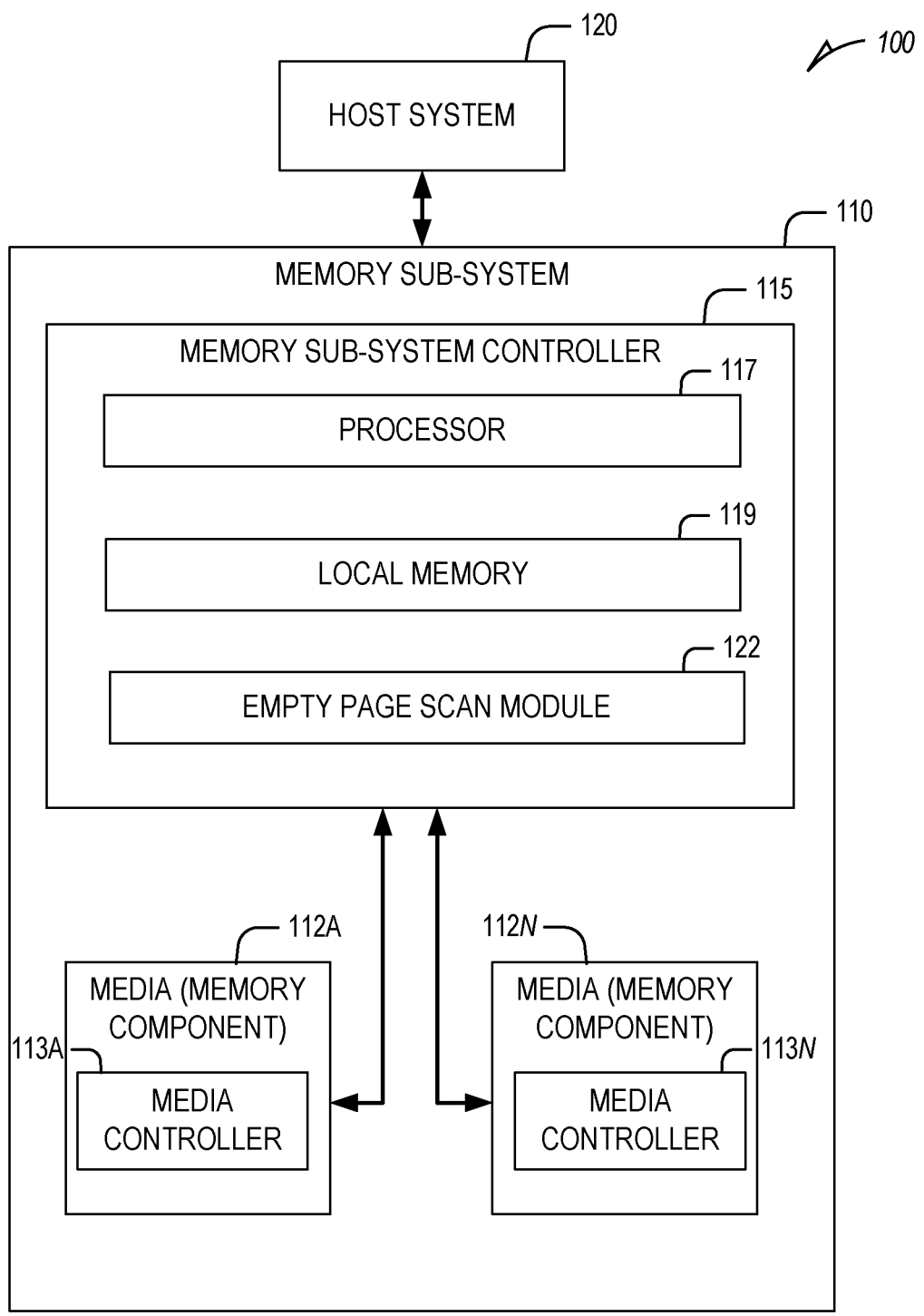
FIG. 1 is a block diagram illustrating an example computing environment including a memory sub-system, in accordance with some embodiments of the present disclosure.

Aspects of the present disclosure configure a system component, such as a memory sub-system controller, to performing empty page scanning operations for a memory sub-system. The memory sub-system controller can tailor the frequency at which empty page scanning is performed for a given portion of memory (e.g., block or page) based on a quantity of errors found in a previous empty page scan operation. In some cases, the word lines (WLs) which are scanned or read during an empty page scan operation are only those which have previously determined to be prone to empty page errors (e.g., are associated with an erasure reliability value that is below a threshold). In this way, the memory sub-system controller can reduce the number of times the empty page scanning operations are performed and also improve the efficiency at which such operations are performed by restricting which WLs are read on the basis of the type of errors that are detected which improves the overall efficiency of operating the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can send access requests (e.g., write command, read command, sequential write command, sequential read command) to the memory sub-system, such as to store data at the memory sub-system and to read data from the memory sub-system. The data specified by the host is hereinafter referred to as "host data" or "user data".

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), etc.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data".

"User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more dice. Each die can comprise one or more planes. For some types of non-volatile memory devices (e.g., NAND devices), each plane comprises a set of physical blocks. For some memory devices, blocks are the smallest area than can be erased. Each block comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package. The memory device can be divided into one or more zones where each zone is associated with a different set of host data or user data or application.

Conventional memory sub-systems maintain a list of empty pages or blocks which are portions of memory that have previously been erased and are valid for programming or writing data. Sometimes, these portions of memory are subject to leakage in current or voltage. The result of such leaks can cause the portions of memory previously indicated to be empty to erroneously reflect storage of information. This is because rather than storing a current or voltage distribution that represents a value of '1' when read (indicating an empty bit), they store a current or voltage distribution representing a value of '0' when read (erroneously indicating a programmed bit). To detect such errors, conventional memory sub-systems perform empty page scan operations. These operations involve reading a distribution of current or voltage from a portion of memory previously indicated to be empty to determine whether the portion still reflects an empty state. If the portion no longer reflects an empty state, that portion is refreshed or sent for re-erasure. The frequency at which the empty portions of memory are analyzed by the empty page scanning operations is usually predetermined and the same across all the memory blocks. This can lead to inefficiencies as certain memory blocks are never prone to empty state errors or leakage. Therefore, applying a one-size-fits-all approach to empty page scanning operations can be wasteful and inefficient which ends up slowing down memory operations.

Aspects of the present disclosure address the above and other deficiencies by configuring a system component, such as a memory sub-system controller, to tailor the frequency at which empty page scanning is performed for a given portion of memory (e.g., block or page) based on a quantity of errors found in a previous empty page scan operation. In some cases, the WLs which are scanned or read during an empty page scan operation are only those which have previously determined to be prone to empty page errors (e.g., are associated with an erasure reliability value that is below a threshold). In this way, the memory sub-system controller can reduce the number of times the empty page scanning operations are performed and also improve the efficiency at which such operations are performed by restricting which WLs are read on the basis of the type of errors that are detected which improves the overall efficiency of operating the memory sub-system.

In some embodiments, the memory sub-system controller selects a portion of the set of memory components that is empty and ready to be programmed. The memory sub-system controller reads one or more signals from the selected portion of the set of memory components and generates an error count value representing whether the portion of the set of memory components is valid for programming based on a result of reading the one or more signals from the selected portion. The memory sub-system controller updates a scan frequency for performing the empty page scan operations for the portion of the set of memory components based on the error count value.

In some embodiments, the memory sub-system controller accesses configuration information associated with the memory sub-system to identify a set of WLs that have an erasure reliability value that is below a threshold. The one or more signals can be read from the identified set of WLs of the selected portion. The memory sub-system controller can generate the error count value by computing a quantity of zeros that result from reading the one or more signals, wherein the scan frequency is updated based on the quantity of zeros. The memory sub-system controller can access a read trim value for reading data from the portion of the set of memory components. The memory sub-system controller compares the one or more signals to the read trim value to generate the error count value.

In some cases, the memory sub-system controller adds an offset to the read trim value based on configuration information associated with the memory sub-system. The error count value can be generated in response to comparing the one or more signals to the read trim value with the added offset.

In some examples, the memory sub-system controller compares the quantity of zeros to a threshold value. In response to determining that the quantity of zeros transgresses the threshold value, the memory sub-system controller determines that the portion of the set of memory components is valid for programming. In some cases, the memory sub-system controller compares the quantity of zeros to a threshold value. In response to determining that the quantity of zeros fails to transgress the threshold value, the memory sub-system controller determines that the portion of the set of memory components is invalid for programming and reperforms an erasure operation on the portion of the set of memory components.

In some examples, the memory sub-system controller selects the portion of the set of memory components that is empty by: identifying a partially programmed block comprising a first set of pages of a plurality of pages that have been programmed; and selecting a page of the plurality of pages that is adjacent to a last page of the set of pages as the portion of the set of memory components. The memory sub-system controller stores a table that associates each of a plurality of error count values with a respective scan frequency for performing the empty page scan operations.

In some examples, the memory sub-system controller accesses a scan frequency associated with the portion of the set of memory components. The memory sub-system controller determines whether an amount of time since the empty page scan operations have been performed on the portion of the set of memory components corresponds to the scan frequency. The memory sub-system controller generates the error count value in response to determining that the amount of time corresponds to the scan frequency. In some cases, the memory sub-system controller determines that the error count value corresponds to a threshold indicating that the set of memory components is valid. The memory sub-system controller updates the scan frequency associated with the portion of the set of memory components in response to determining that the error count value corresponds to the threshold indicating that the set of memory components is valid.

In some cases, the memory sub-system comprises a three-dimensional (3D) NAND storage device. In some cases, the one or more signals include a distribution of electrical signals (e.g., current and/or voltage). The error count value can be generated based on whether the distribution of electrical signals transgresses a read trim value.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals (e.g., download and commit firmware commands/requests) between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory.

In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), three-dimensional (3D) NAND, and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor 117 (processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive I/O commands or operations from the host system 120 and can convert the commands or operations into instructions or appropriate commands to achieve the desired access to the memory components 112A to 112N. The memory sub-system controller 115 can be responsible for other operations, based on instructions stored in firmware in an active slot or associated with an active firmware slot, such as wear leveling operations, garbage collection operations, error detection and ECC operations, decoding operations, encryption operations, caching operations, address translations between a logical block address and a physical block address that are associated with the memory components 112A to 112N, address translations between an application identifier received from the host system 120 and a corresponding zone of a set of zones of the memory components 112A to 112N. This can be used to restrict applications to reading and writing data only to/from a corresponding zone of the set of zones that is associated with the respective applications. In such cases, even though there may be free space elsewhere on the memory components 112A to 112N, a given application can only read/write data to/from the associated zone, such as by erasing data stored in the zone and writing new data to the zone. The memory sub-system controller 115 can further include host interface circuitry to communicate with the host system 120 via the physical host interface. The host interface circuitry can convert the I/O commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component, to communicate with the memory sub-system controller 115, and to execute memory requests (e.g., read or write) received from the memory sub-system controller 115.

In some embodiments, the memory sub-system controller 115 can include an empty page scan module 122. The empty page scan module 122 can tailor the frequency at which empty page scanning is performed for a given portion of memory (e.g., block or page) of the set of memory components 112A to 112N based on a quantity of errors found in a previous empty page scan operation. In some cases, the WLs which are scanned or read during an empty page scan operation are only those which have previously determined to be prone to empty page errors (e.g., are associated with an erasure reliability value that is below a threshold). In this way, the empty page scan module 122 can reduce the number of times the empty page scanning operations are performed and also improve the efficiency at which such operations are performed by restricting which WLs are read on the basis of the type of errors that are detected which improves the overall efficiency of operating the memory sub-system 110.

For example, the empty page scan module 122 can select a portion of the set of memory components that is empty and ready to be programmed. The empty page scan module 122 reads one or more signals from the selected portion of the set of memory components 112A to 112N and generates an error count value representing whether the portion of the set of memory components 112A to 112N is valid for programming based on a result of reading the one or more signals from the selected portion. The empty page scan module 122 updates a scan frequency for performing the empty page scan operations for the portion of the set of memory components 112A to 112N based on the error count value. Subsequent empty page scan operations are performed for the portion of the set of memory components 112A to 112N at a time determined based on the updated scan frequency.

Depending on the embodiment, the empty page scan module 122 can comprise logic (e.g., a set of transitory or non-transitory machine instructions, such as firmware) or one or more components that causes the memory sub-system 110 (e.g., the memory sub-system controller 115) to perform operations described herein with respect to the empty page scan module 122. The empty page scan module 122 can comprise a tangible or non-tangible unit capable of performing operations described herein.

Figure 2:
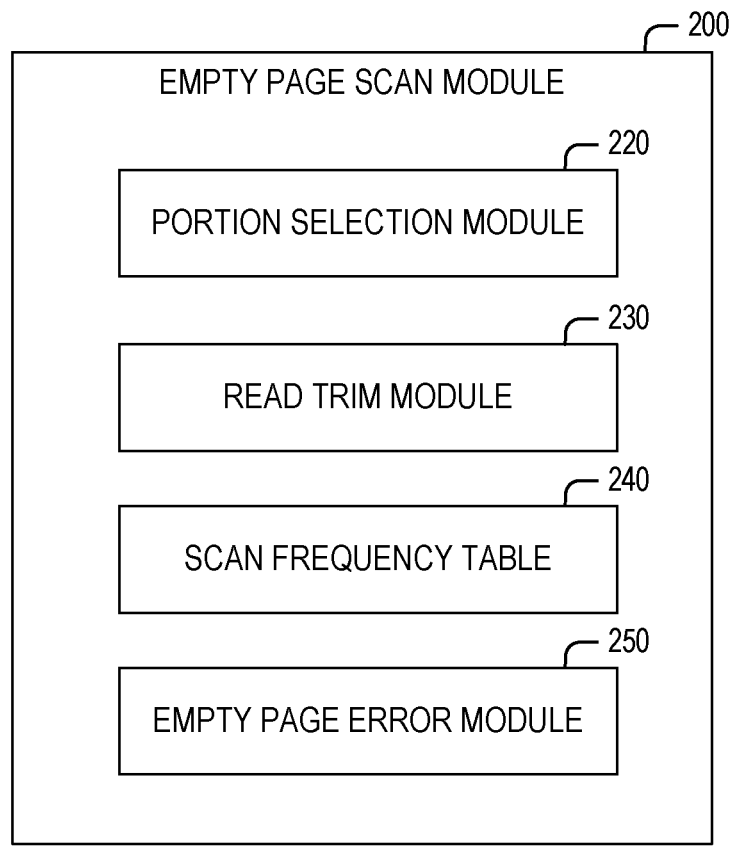
FIG. 2 is a block diagram of an example empty page scan module, in accordance with some implementations of the present disclosure.

FIG. 2 is a block diagram of an example empty page scan module 200, in accordance with some implementations of the present disclosure. The empty page scan module 200 can represent the empty page scan module 122 of FIG. 1. As illustrated, the empty page scan module 200 includes a portion selection module 220, a read trim module 230, a scan frequency table 240, and an empty page error module 250.

The portion selection module 220 accesses a page table or block table to identify one or more portions of the set of memory components 112A to 112N that are currently set to the empty state. Namely, the portion selection module 220 identifies a portion that has previously been erased and is currently ready to be programmed. In some cases, the portion corresponds to an entire block that includes multiple empty pages. In some cases, the portion corresponds to a page within a block of which a portion has been previously programmed. Namely, the block can include a plurality of pages and some but not all of the pages may have been programmed. In such cases, the portion selection module 220 identifies the last page of the block that has been programmed and selects the next adjacent page to the last page that is currently empty.

The portion selection module 220 provides the identification of the selected portion to the empty page error module 250 for analysis. The empty page error module 250 receives an instruction to perform empty page scanning operations on empty pages. The empty page error module 250 can access a timestamp associated with the selected portion to identify the last time that the portion has been analyzed by the empty page error module 250 to determine whether the portion is still empty and valid to be programmed. The empty page error module 250 also obtains the previously determined scan frequency associated with the portion. The previously determined scan frequency can also be stored in association with the last time. The empty page error module 250 can compare the current time to the last time indicated by the timestamp to compute a difference. The empty page error module 250 can compare the difference to the scan frequency to determine whether to re-perform the empty page scanning operation on the selected portion. For example, the scan frequency can correspond to an 18 hour time period. In such cases, the empty page error module 250 can reperform the empty page scanning operation on the selected portion if the difference between the current time and the stored timestamp is greater than or equal to 18 hours.

In response to determining that the selected portion needs to be reanalyzed by the empty page scanning operations, the empty page error module 250 communicates with the read trim module 230. The empty page error module 250 obtains from the read trim module 230 a current default read trim value associated with the memory sub-system 110. The read trim value represents a particular current and/or voltage distribution that needs to be stored in a given cell or bitline in order to read a logic value of '0' from the given cell. If the current and/or voltage distribution transgresses the read trim value, the current and/or voltage distribution can be determined to correspond to a logic value of '1' and otherwise the current and/or voltage distribution is determined to correspond to a logic value of '0' or vice versa. The read trim module 230 can store the default read trim value by accessing configuration information associated with the memory sub-system 110.

The empty page error module 250 adds an offset to the read trim value received from the read trim module 230. Then, the empty page error module 250 accesses the configuration information to identify a set of WLs that are indicated to be associated with an erasure reliability value that is below a threshold. Namely, the configuration information can be generated during manufacture and/or testing of the memory sub-system 110 to identify which WLs are prone to empty state errors. These are the WLs that can be accessed and tested by the empty page scanning operations to verify and determine failure of the selected portion in remaining in the empty state.

The empty page error module 250 retrieves the current and/or voltage distribution signals from the WLs of the selected portion. The empty page error module 250 compares the current and/or voltage distribution signals from the WLs of the selected portion to the read trim value to which the offset has been added. The empty page error module 250 can compute an error count value based on the comparison. The error count value can represent whether the selected portion is valid for programming. For example, the error count value can indicate a quantity of logical '0' values that have been read from the WLs of the selected portion.

In some examples, the empty page error module 250 compares the quantity of logical '0' values to a threshold value to determine whether the selected portion is valid for programming. In response to determining that the quantity of logical '0' values exceed or transgress the threshold, the empty page error module 250 determines that the selected portion is invalid for programming and can cause the selected page to be refreshed (e.g., sent to be erased again). In response to determining that the quantity of logical '0' values fails to exceed or transgress the threshold, the empty page error module 250 determines that the selected portion is still valid for programming. In such cases, the empty page error module 250 communicates with the scan frequency table 240 to identify and update the scan frequency associated with the selected portion.

The scan frequency table 240 can be stored based on configuration information and can associate different error rates, error counts, and/or quantity of logical '0' values with different scan frequencies. For example, as shown in FIG. 3, a scan frequency table 300 is illustrated, according to some implementations. The scan frequency table 300 can correspond to the scan frequency table 240 and can include a page error count row 310 and a scan frequency row 320. The scan frequency table 300 associates each of a plurality of instances of page error counts in the page error count row 310 with a corresponding scan frequency in the scan frequency row 320. For example, a first page error count (representing a first quantity of logical '0's read during the empty page scan operation) can be associated with a first scan frequency (e.g., 24 hours). A second page error count (representing a second quantity of logical '0's read during the empty page scan operation) can be associated with a second scan frequency (e.g., 18 hours). The scan frequency table 300 can also indicate a maximum allowable page error counts which can be used as a threshold to compare against the error count value. If the error count value exceeds the maximum allowable page error counts stored in the scan frequency table 300, the empty page error module 250 refreshes the portion of the set of memory components 112A to 112N.

In some examples, the empty page error module 250 searches the scan frequency table 240 to identify a range of error counts in the page error count row 310 that corresponds to the quantity of logical '0' values that have been read from the selected portion of the set of memory components 112A to 112N. The empty page error module 250 obtains the scan frequency associated with the identified range of error counts. The empty page error module 250 stores a timestamp indicating the current time when the empty page scan operation was performed on the selected portion in association with the selected portion of the set of memory components 112A to 112N. The empty page error module 250 also updates the scan frequency stored in association with the selected portion based on the retrieved scan frequency associated with the identified range of error counts of the scan frequency table 240.

For example, the empty page error module 250 can perform an empty page scan operation on the selected portion of the set of memory components 112A to 112N at a first scan frequency (e.g., every 18 hours) because the last time the operation was performed, the quantity of logical '0' values was within or corresponded to a first range (e.g., 5-10). After performing the empty page scan operation, the empty page error module 250 can determine that now the quantity of logical '0' values falls within or corresponds to a second range (e.g., 11-20) associated with a second scan frequency (e.g., every 12 hours). In such cases, the empty page error module 250 updates the scan frequency stored in association with the selected portion and starts performing the empty page scanning operations at the second scan frequency instead of the first scan frequency.

Figure 4:
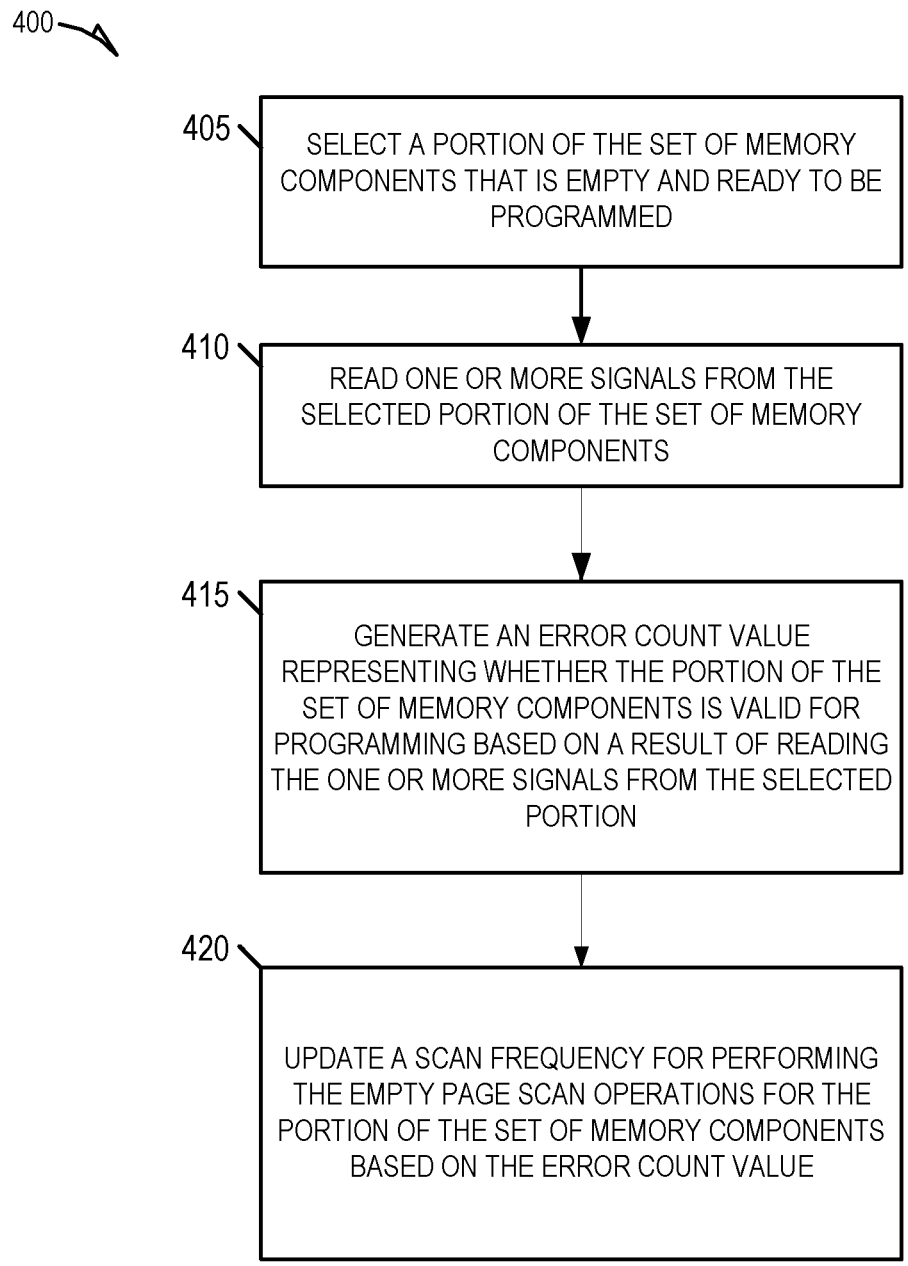
FIGS. 4-5 are flow diagrams of example methods to perform empty page scan operations, in accordance with some implementations of the present disclosure.

FIG. 4 is a flow diagram of an example method 400 to perform empty page scan operations, in accordance with some implementations of the present disclosure. Method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the memory sub-system controller 115 or subcomponents of the controller 115 of FIG. 1. In these embodiments, the method 400 can be performed, at least in part, by the empty page scan module 200. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 4, the method (or process) 400 begin at operation 405, with the empty page scan module 200 of a memory sub-system (e.g., of processor of the memory sub-system controller 115) selecting a portion of the set of memory components that is empty and ready to be programmed. Then, at operation 410, the empty page scan module 200 reads one or more signals from the selected portion of the set of memory components and, at operation 415, generates an error count value representing whether the portion of the set of memory components is valid for programming based on a result of reading the one or more signals from the selected portion. The empty page scan module 200, at operation 420, updates a scan frequency for performing the empty page scan operations for the portion of the set of memory components based on the error count value.

Figure 5:
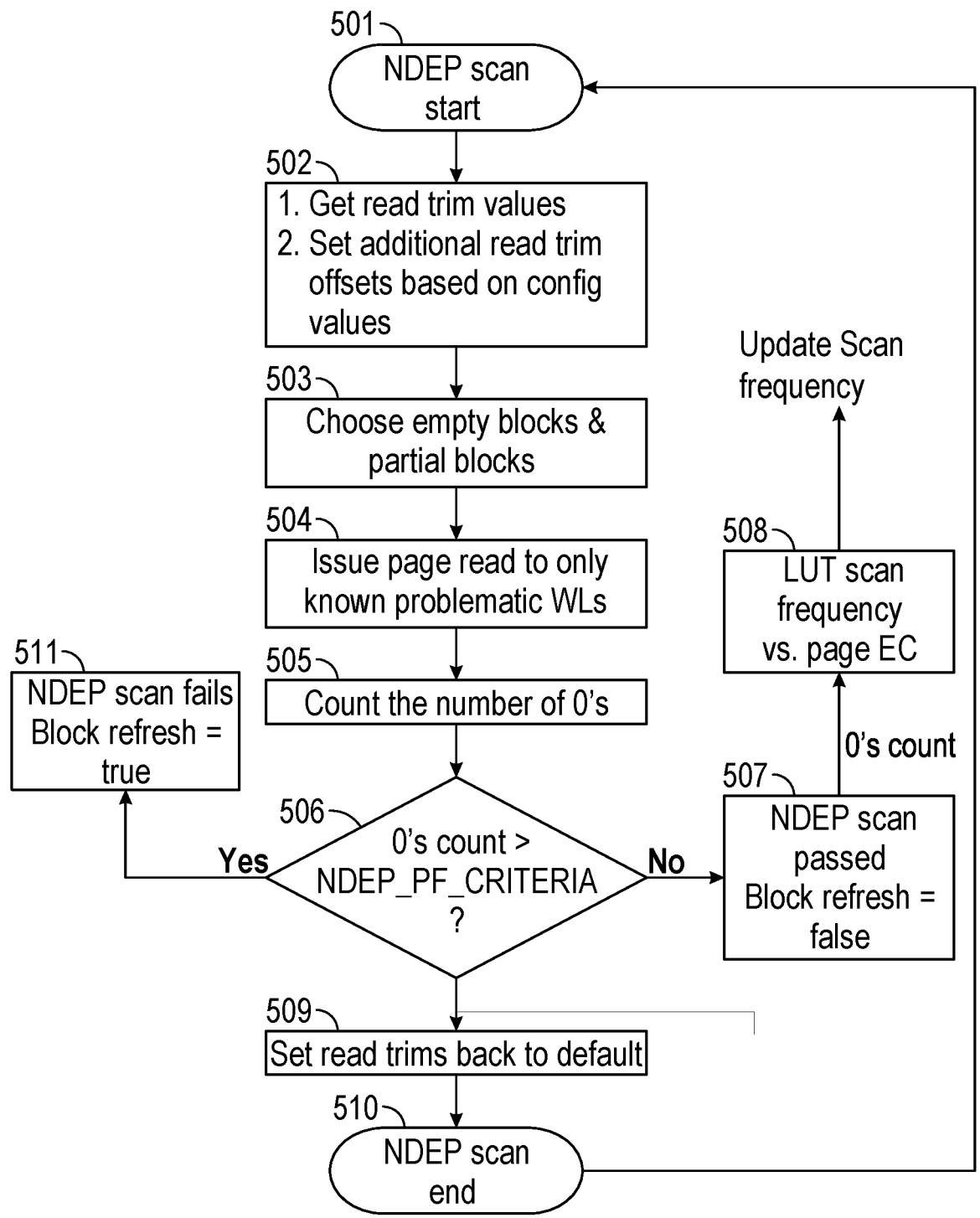

FIG. 5 is a flow diagram of an example method 500 to perform empty page scan operations, in accordance with some implementations of the present disclosure. Method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the memory sub-system controller 115 or subcomponents of the controller 115 of FIG. 1. In these embodiments, the method 500 can be performed, at least in part, by the empty page scan module 200. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 5, the method (or process) 500 begin at operation 501, with the empty page scan module 200 of a memory sub-system (e.g., of processor of the memory sub-system controller 115) starting an NDEP scan operation (e.g., an empty page scan operation). Then, at operation 502, the empty page scan module 200 obtains read trim values (e.g., signal distribution thresholds) and sets read trim offsets based on previously stored and accessed configuration information. The empty page scan module 200, at operation 503, selects empty (previously erased) blocks and/or partially empty blocks and, at operation 504, issues page read requests to the WLs of the selected blocks or partially empty blocks. In some cases, the read requests are only sent and read from WLs that have been previously tested and experimentally determined to have erasure reliability values that are below a threshold.

At operation 505, the empty page scan module 200 counts the number of 0's that result from reading the WLs of the selected blocks and/or pages to generate an error count value. The empty page scan module 200, at operation 506, determines whether the error count value transgresses a threshold by comparing the quantity of that are counted or computed to a criterion or threshold. In response to determining that the error count value transgresses the threshold (e.g., the quantity of 0's is greater than the threshold value), the empty page scan module 200, at operation 511, marks the selected block or portions of the block for re-erasure or causes the selected block or portions of the block to be erased again by performing refresh operations. In response to determining that the error count value fails to transgress the threshold (e.g., the quantity of 0's is less than the threshold value), the empty page scan module 200, at operation 507, determines that the NDEP scan operation was successful and that the selected block or portions of the block are still empty and ready to be programmed. In such cases, the empty page scan module 200, at operation 508, accesses a table (e.g., the table 300 of FIG. 3) to identify the scan frequency associated with the error count value. The empty page scan module 200 updates the scan frequency associated with the block or portion of the block to control when the NDEP scan operation is performed again with respect to the selected block or portion of the block.

At operation 509, the empty page scan module 200 sets the read trim values back to the default values and, at operation 510, the empty page scan module 200 ends the NDEP scan operation.

In view of the disclosure above, various examples are set forth below. It should be noted that one or more features of an example, taken in isolation or combination, should be considered within the disclosure of this application.

Example 1: a system comprising: a memory sub-system comprising a set of memory components; and a processing device, operatively coupled to the set of memory components and configured to perform empty page scan operations comprising: selecting a portion of the set of memory components that is empty and ready to be programmed; reading one or more signals from the selected portion of the set of memory components; generating an error count value representing whether the portion of the set of memory components is valid for programming based on a result of reading the one or more signals from the selected portion; and updating a scan frequency for performing the empty page scan operations for the portion of the set of memory components based on the error count value.

Example 2, the system of Example 1 wherein the operations comprise accessing configuration information associated with the memory sub-system to identify a set of word lines (WLs) that have an erasure reliability value that is below a threshold, wherein the one or more signals are read from the identified set of WLs of the selected portion.

Example 3, the system of Examples 1 or 2, wherein generating the error count value comprises computing a quantity of zeros that result from reading the one or more signals, wherein the scan frequency is updated based on the quantity of zeros.

Example 4, the system of Example 3, wherein the operations comprise accessing a read trim value for reading data from the portion of the set of memory components; and comparing the one or more signals to the read trim value to generate the error count value.

Example 5, the system of Example 4, wherein the operations comprise: adding an offset to the read trim value based on configuration information associated with the memory sub-system, wherein the error count value is generated in response to comparing the one or more signals to the read trim value with the added offset.

Example 6, the system of any one of Examples 1-5, wherein the operations comprise: comparing the quantity of zeros to a threshold value; and in response to determining that the quantity of zeros transgresses the threshold value, determining that the portion of the set of memory components is valid for programming.

Example 7, the system of any one of Examples 1-6, wherein the operations comprise: comparing the quantity of zeros to a threshold value; and in response to determining that the quantity of zeros fails to transgress the threshold value: determining that the portion of the set of memory components is invalid for programming; and reperforming an erasure operation on the portion of the set of memory components.

Example 8, the system of any one of Examples 1-7, wherein selecting the portion of the set of memory components that is empty comprises: identifying a partially programmed block comprising a first set of pages of a plurality of pages that have been programmed; and selecting a page of the plurality of pages that is adjacent to a last page of the set of pages as the portion of the set of memory components.

Example 9, the system of any one of Examples 1-8, wherein the operations comprise: storing a table that associates each of a plurality of error count values with a respective scan frequency for performing the empty page scan operations.

Example 10, the system of any one of Examples 1-9, wherein the operations comprise: accessing a scan frequency associated with the portion of the set of memory components; and determining whether an amount of time since the empty page scan operations have been performed on the portion of the set of memory components corresponds to the scan frequency, wherein the error count value is generated in response to determining that the amount of time corresponds to the scan frequency.

Example 11, the system of Example 10, wherein the operations comprise: determining that the error count value corresponds to a threshold indicating that the set of memory components is valid; and updating the scan frequency associated with the portion of the set of memory components in response to determining that the error count value corresponds to the threshold indicating that the set of memory components is valid.

Example 12, the system of any one of Examples 1-11, wherein the memory sub-system comprises a three-dimensional (3D) NAND storage device.

Example 13, the system of any one of Examples 1-12, wherein the one or more signals comprise a distribution of electrical signals, and wherein the error count value is generated based on whether the distribution of electrical signals transgresses a read trim value.

Methods and computer-readable storage medium with instructions for performing any one of the above Examples.

Figure 6:
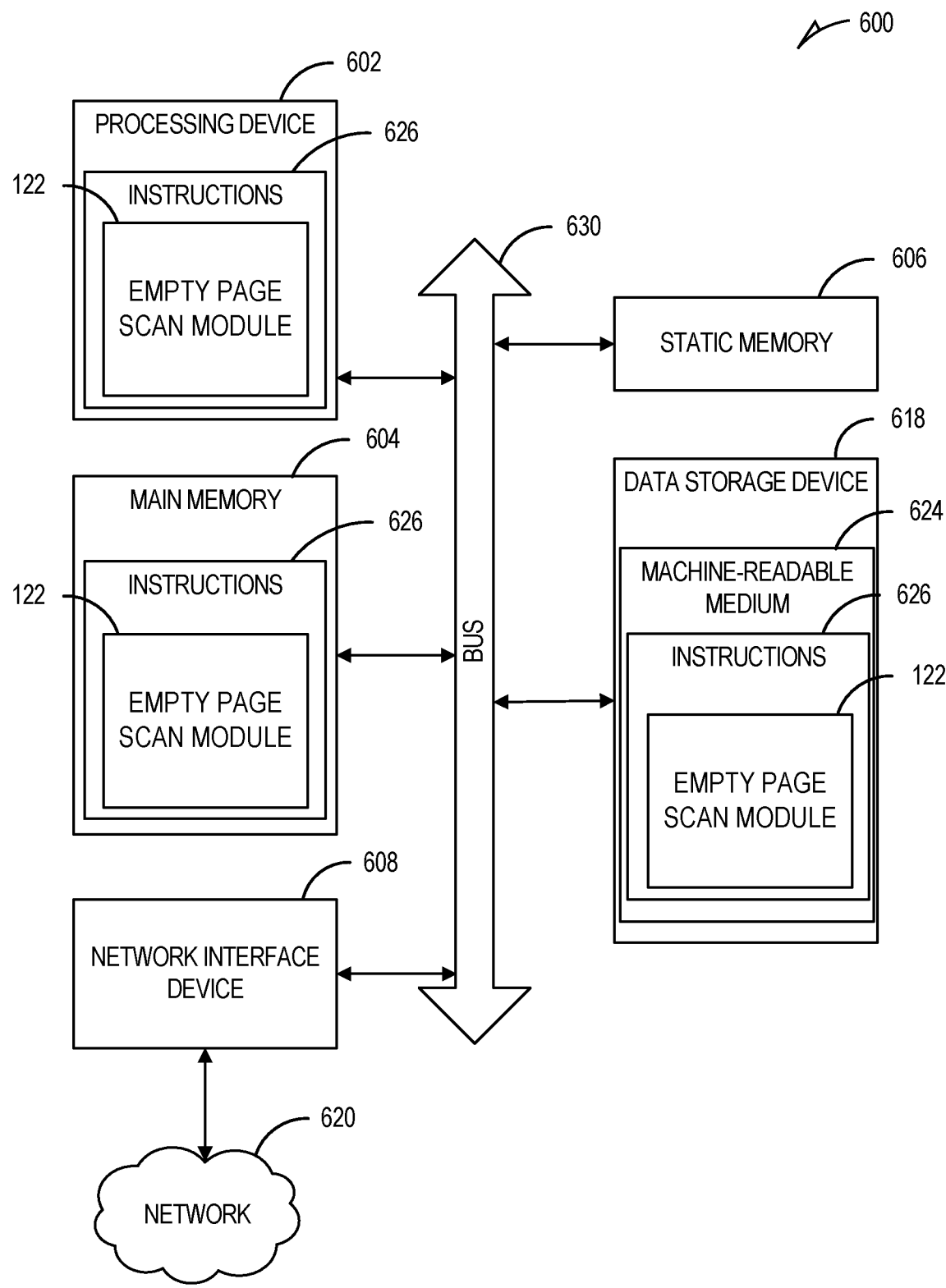
FIG. 6 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the empty page scan module 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to firmware slot manager (e.g., the empty page scan module 122 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the embodiments of the disclosure as set forth in the following claims. The specification and drawings are, accordingly, to be regarded in an illustrative sense rather than a restrictive sense.

What is claimed is:

1. A system comprising:
    a memory sub-system comprising a set of memory components; and
    a processing device, operatively coupled to the set of memory components and configured to perform empty page scan operations comprising:
        selecting a portion of the set of memory components that is empty and ready to be programmed;
        reading one or more signals from the selected portion of the set of memory components;
        generating an error count value representing whether the portion of the set of memory components is valid for programming based on a result of reading the one or more signals from the selected portion; and
        updating a scan frequency for performing the empty page scan operations for the portion of the set of memory components based on the error count value.

2. The system of claim 1, wherein the operations comprise:
    accessing configuration information associated with the memory sub-system to identify a set of word lines (WLs) that have an erasure reliability value that is below a threshold, wherein the one or more signals are read from the identified set of WLs of the selected portion.

3. The system of claim 1, wherein generating the error count value comprises:
    computing a quantity of zeros that result from reading the one or more signals, wherein the scan frequency is updated based on the quantity of zeros.

4. The system of claim 3, wherein the operations comprise:
    accessing a read trim value for reading data from the portion of the set of memory components; and
    comparing the one or more signals to the read trim value to generate the error count value.

5. The system of claim 4, wherein the operations comprise:
    adding an offset to the read trim value based on configuration information associated with the memory sub-system, wherein the error count value is generated in response to comparing the one or more signals to the read trim value with the added offset.

6. The system of claim 3, wherein the operations comprise:
    comparing the quantity of zeros to a threshold value; and
    in response to determining that the quantity of zeros transgresses the threshold value, determining that the portion of the set of memory components is valid for programming.

7. The system of claim 3, wherein the operations comprise:
    comparing the quantity of zeros to a threshold value; and
    in response to determining that the quantity of zeros fails to transgress the threshold value:
        determining that the portion of the set of memory components is invalid for programming; and
        reperforming an erasure operation on the portion of the set of memory components.

8. The system of claim 1, wherein selecting the portion of the set of memory components that is empty comprises:
    identifying a partially programmed block comprising a first set of pages of a plurality of pages that have been programmed; and
    selecting a page of the plurality of pages that is adjacent to a last page of the set of pages as the portion of the set of memory components.

9. The system of claim 1, wherein the operations comprise:
    storing a table that associates each of a plurality of error count values with a respective scan frequency for performing the empty page scan operations.

10. The system of claim 1, wherein the operations comprise:
    accessing a scan frequency associated with the portion of the set of memory components; and
    determining whether an amount of time since the empty page scan operations have been performed on the portion of the set of memory components corresponds to the scan frequency, wherein the error count value is generated in response to determining that the amount of time corresponds to the scan frequency.

11. The system of claim 10, wherein the operations comprise:
    determining that the error count value corresponds to a threshold indicating that the set of memory components is valid; and
    updating the scan frequency associated with the portion of the set of memory components in response to determining that the error count value corresponds to the threshold indicating that the set of memory components is valid.

12. The system of claim 1, wherein the memory sub-system comprises a three-dimensional (3D) NAND storage device.

13. The system of claim 1, wherein the one or more signals comprise a distribution of electrical signals, and wherein the error count value is generated based on whether the distribution of electrical signals transgresses a read trim value.

14. A method comprising:
    selecting a portion of a set of memory components that is empty and ready to be programmed;
    reading one or more signals from the selected portion of the set of memory components;
    generating an error count value representing whether the portion of the set of memory components is valid for programming based on a result of reading the one or more signals from the selected portion; and
    updating a scan frequency for performing empty page scan operations for the portion of the set of memory components based on the error count value.

15. The method of claim 14, further comprising:
    accessing configuration information associated with a memory sub-system to identify a set of word lines (WLs) that have an erasure reliability value that is below a threshold, wherein the one or more signals are read from the identified set of WLs of the selected portion.

16. The method of claim 14, wherein generating the error count value comprises:
    computing a quantity of zeros that result from reading the one or more signals, wherein the scan frequency is updated based on the quantity of zeros.

17. The method of claim 16, further comprising:
    accessing a read trim value for reading data from the portion of the set of memory components; and
    comparing the one or more signals to the read trim value to generate the error count value.

18. The method of claim 17, further comprising:
    adding an offset to the read trim value based on configuration information associated with a memory sub-system, wherein the error count value is generated in response to comparing the one or more signals to the read trim value with the added offset.

19. The method of claim 16, further comprising:
    comparing the quantity of zeros to a threshold value; and
    in response to determining that the quantity of zeros transgresses the threshold value, determining that the portion of the set of memory components is valid for programming.

20. A non-transitory computer-readable storage medium comprising instructions that, when executed by a processing device, cause the processing device to perform operations comprising:
    selecting a portion of a set of memory components that is empty and ready to be programmed;
    reading one or more signals from the selected portion of the set of memory components;
    generating an error count value representing whether the portion of the set of memory components is valid for programming based on a result of reading the one or more signals from the selected portion; and
    updating a scan frequency for performing empty page scan operations for the portion of the set of memory components based on the error count value.

* * * * *